United States Patent
Oh et al.

(10) Patent No.: US 6,700,153 B2
(45) Date of Patent: Mar. 2, 2004

(54) ONE-CYLINDER STACK CAPACITOR AND METHOD FOR FABRICATING THE SAME

(75) Inventors: Jung-Hwan Oh, Seoul (KR); Ki-Hyun Hwang, Yongin (KR); Jae-Young Park, Osan (KR); In-Seak Hwang, Suwon (KR); Young-Wook Park, Suwon (KR)

(73) Assignee: Samsung Electronics Co. Ltd., Suwon (KR)

( * ) Notice: Subject to any disclaimer, the term of this patent is extended or adjusted under 35 U.S.C. 154(b) by 0 days.

(21) Appl. No.: 10/136,385

(22) Filed: May 2, 2002

(65) Prior Publication Data

US 2003/0121132 A1 Jul. 3, 2003

(30) Foreign Application Priority Data

Dec. 11, 2001 (KR) ......................................... 2001-78286

(51) Int. Cl.⁷ ............................................. H01L 27/108
(52) U.S. Cl. ........................ 257/309; 257/301; 257/303; 438/253; 438/396
(58) Field of Search ................................. 257/301, 303, 257/306, 309; 438/239, 253, 396

(56) References Cited

U.S. PATENT DOCUMENTS

| | | | | |
|---|---|---|---|---|
| 5,434,812 A | * | 7/1995 | Tseng | 365/149 |
| 5,468,684 A | * | 11/1995 | Yoshimori et al. | 438/3 |
| 5,545,585 A | | 8/1996 | Wang et al. | |
| 5,763,286 A | | 6/1998 | Figura et al. | |
| 5,885,865 A | * | 3/1999 | Liang et al. | 438/253 |
| 6,022,772 A | | 2/2000 | Watanabe et al. | |
| 6,168,987 B1 | * | 1/2001 | Jeng et al. | 438/253 |
| 6,268,244 B1 | * | 7/2001 | Park | 438/253 |
| 2001/0018248 A1 | * | 8/2001 | An | 438/253 |
| 2001/0034114 A1 | | 10/2001 | Liaw | |
| 2002/0000596 A1 | * | 1/2002 | Carstensen | 257/296 |
| 2002/0019107 A1 | * | 2/2002 | Lin et al. | 438/396 |
| 2002/0028553 A1 | * | 3/2002 | Yokoyama et al. | 438/253 |

FOREIGN PATENT DOCUMENTS

| | | | | |
|---|---|---|---|---|
| GB | 2276980 | | 10/1994 | |
| JP | 4-3-259567 | * | 11/1991 | 257/301 |
| JP | 4-5-6974 | * | 1/1993 | 257/301 |
| JP | 2001-57413 | | 2/2001 | |

OTHER PUBLICATIONS

Fukuzumi et al., Liner–Supported Cylinder (LSC) Technology to realize Ru/Ta2O5/Ru Capacitor for Future DRAMs, 2000, IEEE, IEDM 00, pp. 793–796.*

Combined Search and Examination Report Under Sections 17 and 18(3) from the UK Patent Office dated Jul. 9, 2003.

* cited by examiner

*Primary Examiner*—George Eckert

(57) ABSTRACT

An etch stop layer is formed over a surface of an interlayer insulating layer and over a surface of a conductive plug extending at a depth from the surface of the interlayer insulating layer. A lower mold layer is deposited over the etch stop layer, and a wet etch rate of the lower mold layer is adjusted by adding dopants to the lower mold layer during formation of the lower mold layer, and by annealing the lower mold layer. An upper mold layer is then deposited over the surface of the lower mold layer, such that a wet etch rate of the upper mold layer is less than the adjusted wet etch rate of the lower mold layer. The upper mold layer, the lower mold layer and the etch stop layer are then subjected to dry etching to form an opening therein which exposes at least a portion of the surface of the contact plug. Then a wet etching of the upper mold layer and the lower mold layer is performed so as to increase a size of the opening at the lower mold layer and so at to expose a surface portion of the etch stop layer adjacent the surface of the conductive plug. A conductive material is then deposited over the surface of the opening in the upper and lower mold layers to define a capacitor electrode.

6 Claims, 17 Drawing Sheets

ONE-CYLINDER STACK CAPACITOR AND METHOD FOR FABRICATING THE SAME

BACKGROUND OF THE INVENTION

1. Field of the Invention

The present invention generally relates to one-cylinder stack (OCS) capacitors and to methods of fabricating the same, and more particularly, the present invention relates to OCS capacitors which have been formed from a double-mold, and to methods of fabricating OCS capacitors using a double-mold.

2. Description of the Related Art

As semiconductor devices increase in memory cell density, the area occupied by capacitors of the memory cells has decreased. Capacitance is proportional to the dielectric constant of the capacitor dielectric and to the surface area of the capacitor electrodes. Thus, to increase capacitance, it is necessary to either select a dielectric of increased dielectric constant and/or to increase the surface area of the capacitor electrodes. However, adopting new dielectric materials is generally expensive and time-consuming in that it is often necessary to supply new manufacturing equipment, to verify the reliability of the dielectric materials, and to ensure the ability to mass produce devices having the dielectric materials. Therefore, increasing the surface area of electrodes is usually the most cost-effective means of satisfying a requirement for increased capacitance of a device having conventional dielectrics, such as dielectric (NO) layers composed of a stack of silicon nitride and silicon oxide layers.

Hemispherical grain (HSG) electrodes are used in conventional 128-Mbit or less DRAMs to increase the effective surface area of the electrodes. However, these electrodes cannot be applied in highly integrated devices of 256-Mbit or greater because any reduction in spacing between electrodes is limited due to the presence of HSGs on the surface of the electrodes. As such, in the case of a one-cylinder stack (OCS) storage electrode, increasing the height of the electrode from 1.4 $\mu$m to 1.6 $\mu$m, for example, has generally been considered the most efficient means of increasing the capacitance thereof.

The fabrication of a conventional OCS storage electrode will now be described with reference to FIGS. 1–6. In particular, an OCS capacitor storage electrode having a design rule of less than 1.2 $\mu$m is typically formed using a single mold. Referring to FIG. 1, an etch stop layer (not shown) is formed on an interlayer insulating layer 10 having a contact plug 15 in a surface thereof, and an oxide layer (not shown) is formed to a thickness h1, which substantially corresponds to the desired height of an electrode. Next, the oxide layer and the etch stop layer are sequentially etched into an oxide mold 30 having an underlying etch stop 20. In this manner, an opening 40 is defined over the contact plug 15, thereby exposing the contact plug 15. Then, as shown in FIG. 2, polysilicon is deposited on the sidewalls of the opening 40 and on the contact plug 15 so that a cylindrical electrode 50 is formed.

Reference is made to the scanning electron microscopic (SEM) photograph of FIG. 3. As mentioned previously, to increase the capacitance in the case of highly integrated devices, it is desired to increase the height of the OCS capacitor storage electrode to 1.6 $\mu$m or greater. However, noting that etching limitations set the slope of the sidewalls of the opening 40, if the height of the oxide mold layer is increased from h1 to h2 (about 1.8 $\mu$m) and a lower critical dimension (d) of the opening 40 is maintained, a bridge B (FIGS. 2 and 3) may be formed between neighboring OCS capacitor storage electrodes, thereby causing a twin-bit failure. In an effort to avoid twin-bit failures, the upper critical dimension (a) of the opening 40 can be reduced by reducing the lower critical dimension (d) of the opening 40. However, this approach is disadvantageous in that the surface area at the bottom of the opening 40 is reduced, thereby reducing capacitance.

It is also noted that twin-bit failures can occur as a result of storage electrodes falling down and contacting adjacent electrodes. As such, consideration must be given to the structural integrity of the electrodes.

That is, referring now to FIG. 4, after separation of the storage electrodes for cell isolation has been ensured, the oxide mold 30 is removed by wet etching. During this wet etching process, an etchant can permeate into the interface between each storage electrode 50 and an etch stop 20, thus etching the interlayer insulating layer 10. This can weaken the foundation of the storage electrode, causing the storage electrode to tip over and contact adjacent electrodes. FIG. 5A is a scanning electron microscopic (SEM) photograph showing an example in which falling electrodes have resulted in a depression having an @-shaped pattern, and FIG. 5B is a scanning electron microscopic (SEM) photograph showing a cross-sectional side view of electrodes falling into one another.

Therefore, there is an increasing need for a new OCS capacitor structure and a method for fabricating the same in which depressions and bridging between adjacent electrodes can be effectively avoided even in the case where the capacitor height is on the order of 1.6 $\mu$m or more.

SUMMARY OF THE INVENTION

According to one aspect of the present invention, a method of fabricating a capacitor electrode includes forming an etch stop layer over a surface of an interlayer insulating layer and over a surface of a conductive plug extending at a depth from the surface of the interlayer insulating layer; forming a lower mold layer over the etch stop layer, and adjusting a wet etch rate of the lower mold layer by adding dopants to the lower mold layer during formation of the lower mold layer, and by annealing the lower mold layer; forming an upper mold layer over the surface of the lower mold layer, wherein a wet etch rate of the upper mold layer is less than the adjusted wet etch rate of the lower mold layer; dry etching the upper mold layer, the lower mold layer and the etch stop layer to form an opening therein which exposes at least a portion of the-surface of the contact plug; wet etching the upper mold layer and the lower mold layer so as to increase a size of the opening at the lower mold layer and so at to expose a surface portion of the etch stop layer adjacent the surface of the conductive plug; and depositing a conductive material over the surface of the opening in the upper and lower mold layers, the surface portion of the etch stop layer, and an exposed surface of the conductive plug.

According to another aspect of the present invention, a method of fabricating a capacitor includes forming a lower electrode over an interlayer insulating layer, forming a dielectric layer over the lower electrode, and forming an upper electrode over the dielectric layer. Here, formation of the lower electrode includes forming an etch stop layer over a surface of the interlayer insulating layer and over a surface of a conductive plug extending at a depth from the surface of the interlayer insulating layer; forming a lower mold layer over the etch stop layer, and adjusting a wet etch rate of the lower mold layer by adding dopants to the lower mold layer during formation of the lower mold layer, and by annealing the lower mold layer; forming an upper mold layer over the surface of the lower mold layer, wherein a wet etch rate of the upper mold layer is less than the adjusted wet etch rate of the lower mold layer; dry etching the upper mold layer, the lower mold layer and the etch stop layer to form aN opening therein which exposes at least a portion of the surface of the contact plug; wet etching the upper mold layer and the lower mold layer so as to increase a size of the opening at the lower mold layer and so at to expose a surface portion of the etch stop layer adjacent the surface of the conductive plug; and depositing a conductive material over the surface of the opening in the upper and lower mold layers, the surface portion of the etch stop layer, and an exposed surface of the conductive plug.

According to still another aspect of the present invention, a capacitor includes an interlayer insulating layer having a surface; a conductive plug extending at a depth from the surface of the interlayer insulating layer; an etch stop layer extending over the insulating layer and exposing the conductive plug; a cylindrical lower electrode defined by a cylindrical wall and a bottom wall which extends over a surface of the conductive plug and over a portion of the etch stop layer adjacent the conductive plug, wherein the cylindrical wall extends upwardly from the bottom wall away from the surface of the interlayer insulating layer; a dielectric layer formed over the cylindrical lower electrode; and an upper electrode formed over the dielectric layer. The cylindrical wall of the cylindrical lower electrode is defined by an upper cylindrical wall portion, a lower cylindrical wall portion, and an intermediate cylindrical wall portion located between the upper and lower cylindrical wall portions. A diameter of the upper cylindrical wall portion and a diameter of the lower cylindrical wall portion increase with an increase in a distance from the surface of the bottom wall, and a diameter of the intermediate cylindrical wall portions decreases with an increase in a distance away from the surface of the bottom wall, and $$A \geq C, C > B, \text{ and } C > D$$

where A is a diameter of the upper cylindrical wall portion at a location farthest from the bottom wall, B is a diameter of the upper cylindrical wall portion at a location nearest to the bottom wall, C is a diameter of the lower cylindrical wall portion at a location farthest from the bottom wall, and D is a diameter of the lower cylindrical wall portion at the bottom wall.

BRIEF DESCRIPTION OF THE DRAWINGS

The above and other aspects and advantages of the present invention will become more readily apparent from the detailed description that follows, with reference to the accompanying drawings, in which.

DETAILED DESCRIPTION OF THE INVENTION

Embodiments of the present invention will now be described with reference to the accompanying drawings. It is noted that the drawings are presented for illustrative and explanatory purposes only, and are not necessarily drawn to scale.

A method of fabricating a one-cylinder stack (OCS) capacitor according to the present invention will be described with reference to FIGS. 6–13. As will be appreciated by those skilled in the art, the term "cylindrical" is used herein to denote a particular type of capacitor electrode having a generally circular, elliptical or oval sidewall (which may be slanted), and not to denote any precise geometric shapes which as defined in a purely mathematical sense.

Figure 1:
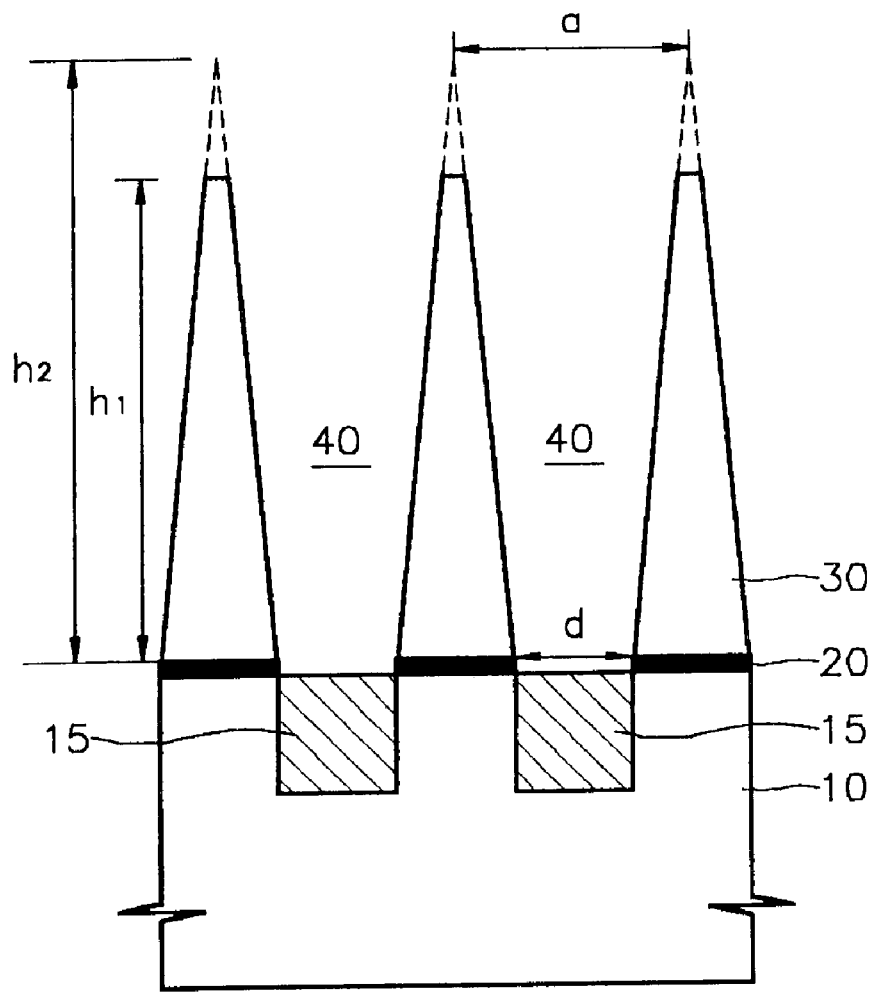
FIGS. 1 and 2 are sectional views for explaining a conventional method for fabricating a capacitor using a single mold.
Figure 2:
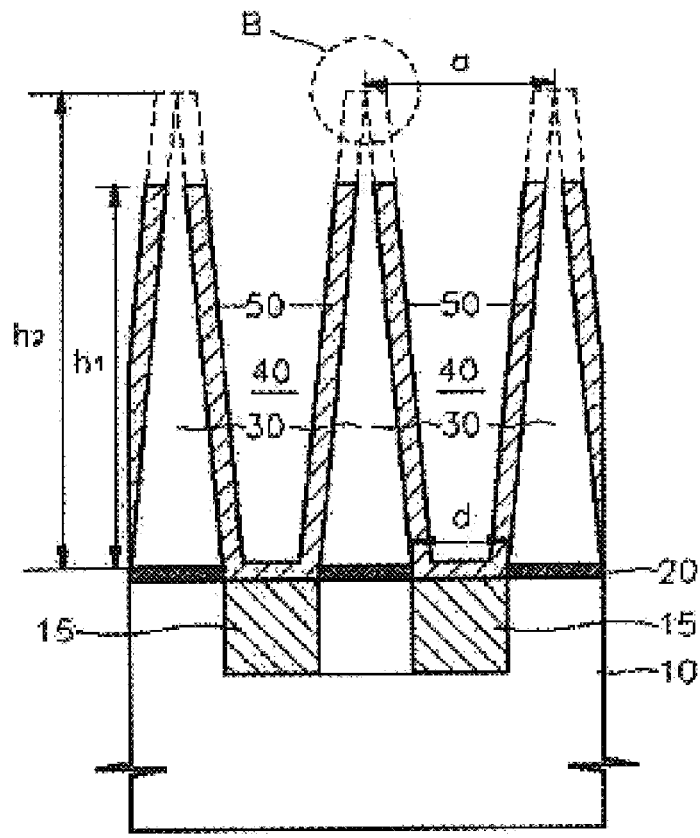
Figure 3:
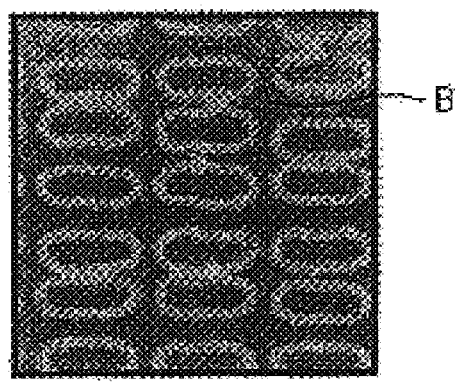
FIG. 3 is a scanning electron microscopic (SEM) photograph of storage electrodes manufactured by the conventional method.
Figure 4:
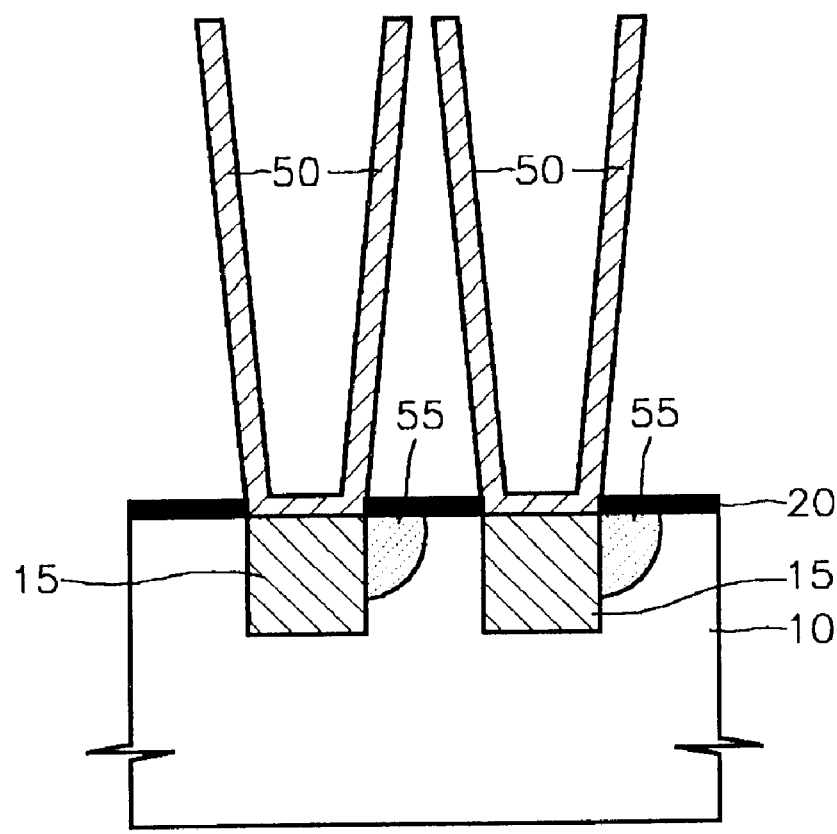
FIG. 4 is another sectional view for explaining the conventional method for fabricating a capacitor using a single mold.
Figure 5A:
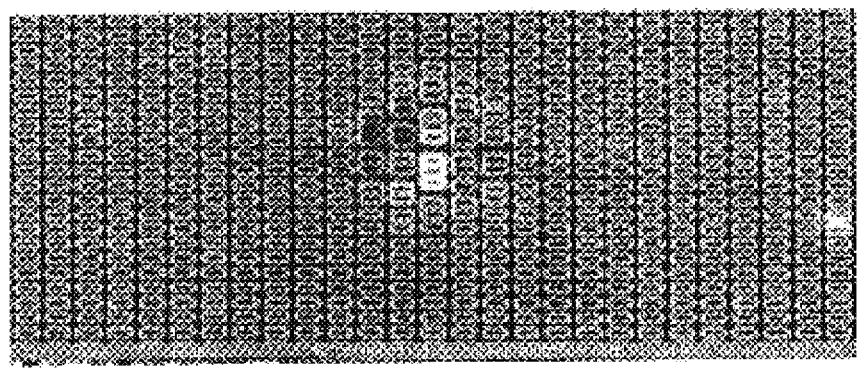
FIGS. 5A and 5B are SEM photographs taken from a top viewpoint and a side viewpoint, respectively, of storage electrodes fabricated by the conventional method.
Figure 5B:
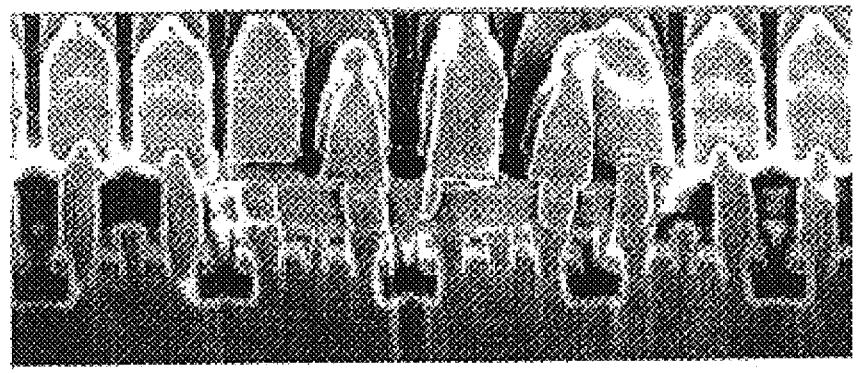
Figure 6:
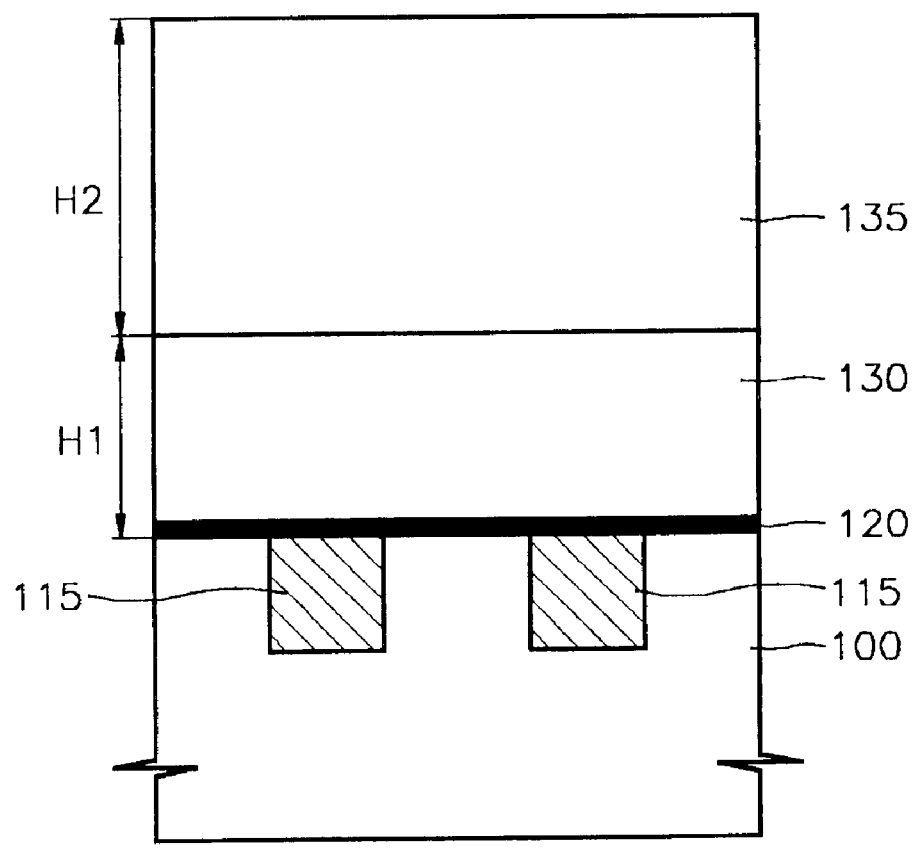
FIGS. 6 through 13 are sectional views for explaining a method for fabricating a one-cylinder stack capacitor using a double mold according to an embodiment of the present invention.

Referring first to FIG. 6, an interlayer insulating layer 100 and a contact plug 155 extending at a depth within the surface of the layer 100 are formed over a substrate (not shown) by known processes. An etch stop layer 120 is then formed then successively formed over the etch stop 120 as shown.

The etch stop layer 120 acts as an etch barrier during subsequent etching (described later) of the upper and lower mold insulating layers 135 and 130 formed thereon, and thus a material for the etch stop layer 120 is selected in consideration of the etching properties of the upper and lower mold insulating layers 135 and 130. As one example only, if the upper and lower mold insulating layers 135 and 130 are oxide layers, the etch stop layer 120 may be formed of silicon nitride to a thickness of 100–500 Å.

The upper and lower mold insulating layers 135 and 130 constitute a double layer which will be etched into a double mold for fabrication of a lower capacitor electrode. The lower mold insulating layer 130 is formed of a material which exhibits a greater wet etch rate than the material of the upper mold insulating layer 135.

The wet etch rate of an insulating material is influenced by the concentration of dopants implanted into the same. The larger the dose, the higher the wet etch rate. Accordingly, to achieve differing wet etch rates as mentioned above, the lower mold insulating layer 130 may be formed of a doped insulating layer, whereas the upper mold insulating layer 135 may be formed of an undoped (or lesser doped) insulating layer.

Preferably, the lower mold insulating layer 130 is formed of a doped oxide layer by chemical vapor deposition (CVD). Suitable doped oxide layers include borophosphosilicate glass (BPSG) and phosphosilicate glass (PSG). Preferably, the upper mold insulating layer 135 is formed of an undoped oxide layer by plasma enhanced chemical vapor deposition (CVD). Suitable undoped oxide layers include plasma-enhanced tetraethylorthosilicate (PE-TEOS) layers, high-density plasma (HDP) oxide layers, and P—SiH$_4$ oxide layers.

The height H1 of the lower mold insulating layer 130 and the height H2 of the upper mold insulating layer 135 are determined according to the target height of the storage electrode to be fabricated and the etch properties of the upper and lower mold insulating layers 135 and 130. In particular, the height H1 of the lower mold insulating layer 130 is determined such that an opening to be formed therein exhibits certain upper and lower maximum diameters (described later). For example, when the lower mold insulating layer 130 is formed of a BPSG layer and the target height of the fabricated storage electrode is 1.6 μm or greater, it is preferable that the height H1 of the lower mold insulating layer 130 is in the range of 0.5–0.6 μ m, and the height H2 of the upper mold insulating layer 135 is in the range of 1.1–1.4 μm. The height H1 of the lower mold insulating layer 130 and the height H2 of the upper mold insulating layer 135 will vary depending on the materials used for the insulating layers and the target height of the fabricated storage electrode.

After deposition of the lower mold insulating layer 130 and before deposition of the upper mold insulating layer 135, the lower mold insulating layer 130 may be optionally subjected to annealing and/or surface cleaning processes.

That is, the wet etch rate of the lower mold insulating layer 130 can be controlled by annealing. More specifically, implanting ions in the lower mold layer 130 for the purpose of increasing the wet etch rate can often result in the wet etch rate being increased too much. Annealing can be effectively used to more precisely lower the wet etch rate after the implantation process. As such, implantation followed by annealing is an effective mechanism for fine tuning the wet etch rate. For example, when the lower mold insulating layer 130 is formed of a BPSG layer doped with boron (B) and phosphorous (P), each at a concentration of 2–3% by weight, annealing is preferable to bring down the etch rate. On the other hand, when the lower mold insulating layer 130 is formed of a PSG layer doped with P at a concentration of no greater than 5% by weight, annealing of the lower mold insulating layer 130 can be omitted.

The annealing itself is performed at a range of temperatures at which cracking of the lower mold insulating layer 130 is avoided, and preferably, at a temperature which is lower than the deposition temperature of the etch stop layer 120. For example, when the etch stop layer 120 is formed of a silicon nitride layer, the lower mold insulating layer 130 is preferably annealed at a temperature of 700° C. or less.

After annealing, the lower mold insulating layer 130 may also be subjected to a surface cleaning process. For example, when the lower mold insulating layer and the upper mold insulating layer 135 are not formed in-situ, a considerable amount of time may elapse from the formation of the lower mold insulating layer 130 to the formation of the upper mold insulating layer 135. In this case, moisture can be absorbed by the dopants implanted into the lower mold insulating layer 130, thus forming an amorphous defect layer on the surface of the lower mold insulating layer 130 This amorphous defect layer can exhibit a wet etch rate which is greater than the remainder of the lower mold insulating layer 130. It is therefore preferable to perform surface cleaning to remove the amorphous defect layer either after annealing or after deposition of the lower mold insulating layer 130. A sulfuric acid solution may be used for this purpose.

The cleaning process for removing the amorphous defect layer can be omitted when the formation of the amorphous defect layer has been avoided in the first place, i.e., when the lower mold insulating layer 130 and the upper mold insulating layer 135 are formed in-situ, or when the lower mold insulating layer 130 is exposed to air either not at all or for only a short period of time prior to deposition of the upper mold insulating layer 135.

Figure 7:
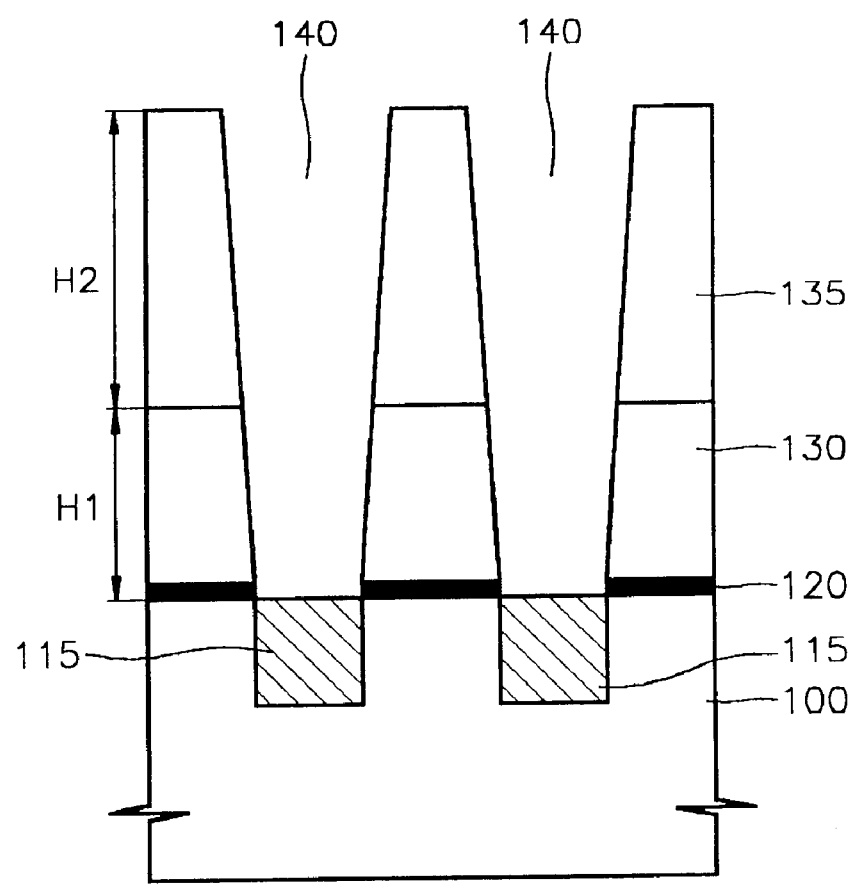

Next, referring to FIG. 7, the upper mold insulating layer 135, the lower mold insulating layer 130, and the etch stop 120 are sequentially dry etched using a mask (not shown) to form an opening 140. The dry etching may be carried out using a CF$_x$ gas, such as C$_4$F$_4$ or C$_3$F$_8$ gases. Process limitations of the dry etch result in the opening 140 being defined by sidewalls which are slanted (not perpendicular) relative to the surface of interlayer insulating layer 100. In other words, the opening 140 tapers outwardly in a height direction such that a diameter of the opening is greater at its top than at its bottom.

Figure 8:
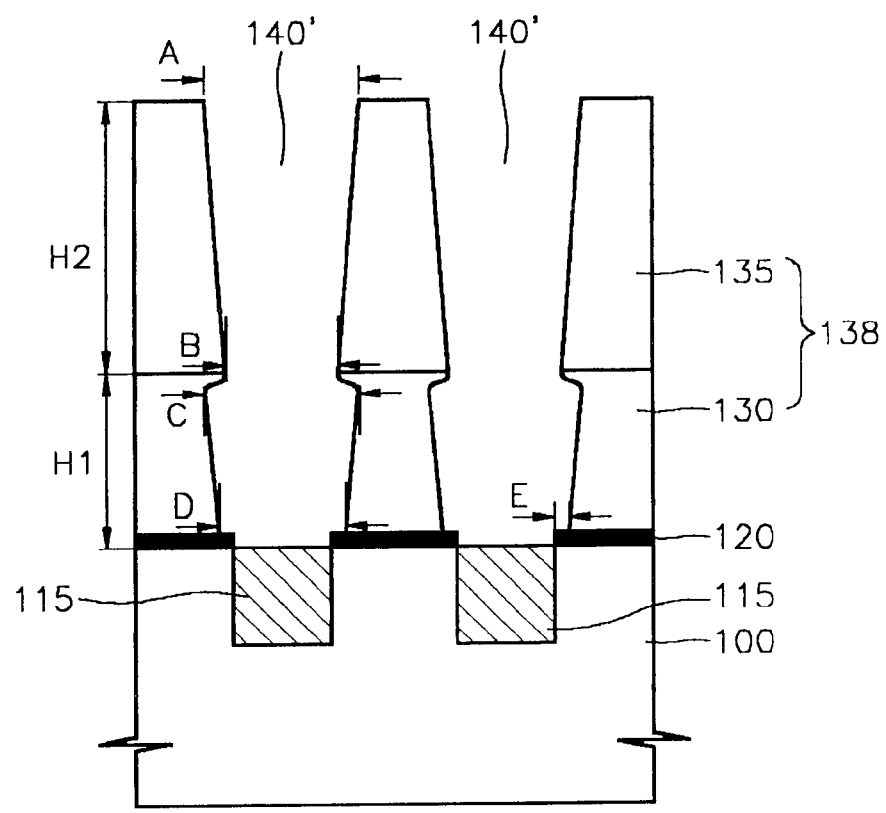

Referring now to FIG. 8, a selective wet etch is carried out to complete the formation of a double mold 138. Since the lower insulating mold 130 is formed of a material layer having a wet etch rate which is greater than the upper insulating mold 135, more of the lower insulating mold 130 is removed by the wet etch than the upper insulating mold 135. As such, a vase-like opening 140' is defined in the double mold 138 as shown. While the upper insulating mold 135 may be slightly etched, this slight etching advantageously functions as a pre-cleaning prior to formation of a storage electrode (described later). Preferably, the wet etching is performed using SC1 (NH$_4$OH/H$_2$O$_2$/deionized water) and hydrofluoric acid (HF) in sequence.

The wet etching is performed under conditions which achieve certain designed dimensions within the opening 140', herein referred to as critical dimensions A, B, C, D and E. As shown in FIG. 8, A is the maximum width (or diameter) of the opening 140' at the upper insulating mold 135; B is the minimum width (or diameter) of the opening 140' at the upper insulating mold 135; C is the maximum width (or diameter) of the opening 140' at the lower insulating mold 130; D is the minimum width (or diameter) of the opening 140' at the lower insulating mold 130; and E is an exposed amount of the etch stop 120 at the bottom of the opening 140'. As examples, it is preferable that critical dimension C of the opening 140' is equal to or smaller than a critical dimension A. In addition, it is preferable that critical dimension E is sufficient to prevent etchant from permeating into the interlayer insulating layer during removal of the double mold 138 in a subsequent wet process (described later).

For example, to form a storage electrode having a height of 1.6 μm or greater, it is preferable that the lower critical dimension D of the opening 140' is not less than 145 μm and the exposed length E of the etch stop 120 is not less than 15 nm.

Other parameters that affect wet etching conditions for the double mold 138 include the concentration of dopants in the lower insulating mold 130 (i.e., the etch rate of the material) and a wet etch time.

Figure 9:
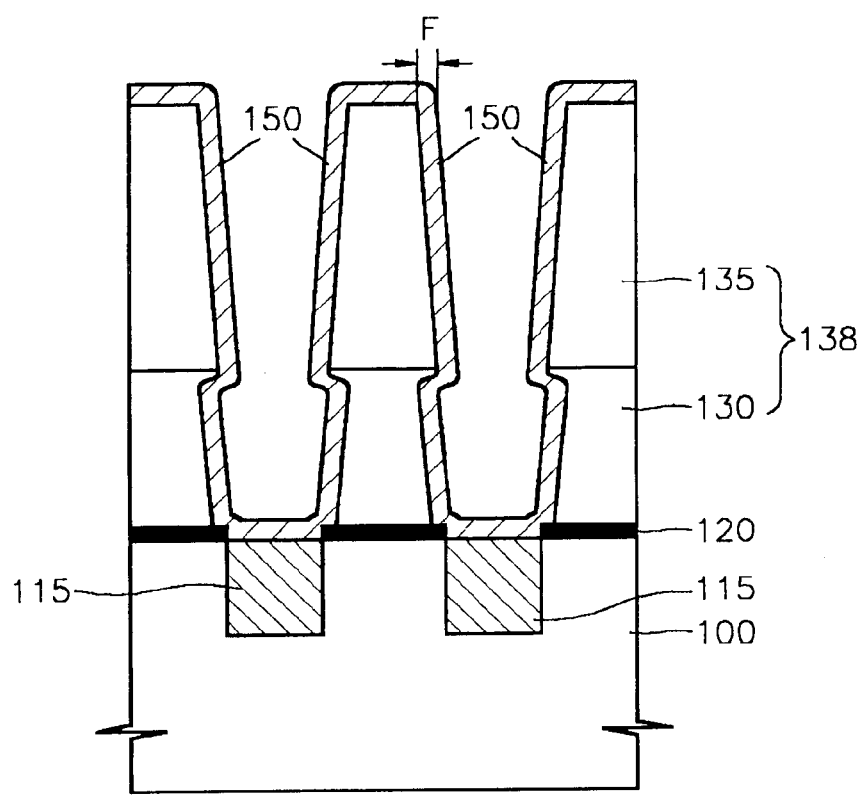

Referring to FIG. 9, a conductive layer 150 is formed so as to conform to the sidewalls, bottom and the top of the double mold 138. The conductive layer 160 defines a lower electrode and may be formed of a polysilicon layer or a doped polysilicon layer. A thickness F of the conductive layer 150 may be in a range of 30–60 nm, and in the case of a storage electrode having a height of 1.6 μm or greater, the thickness F may be about 45 nm.

Figure 10:
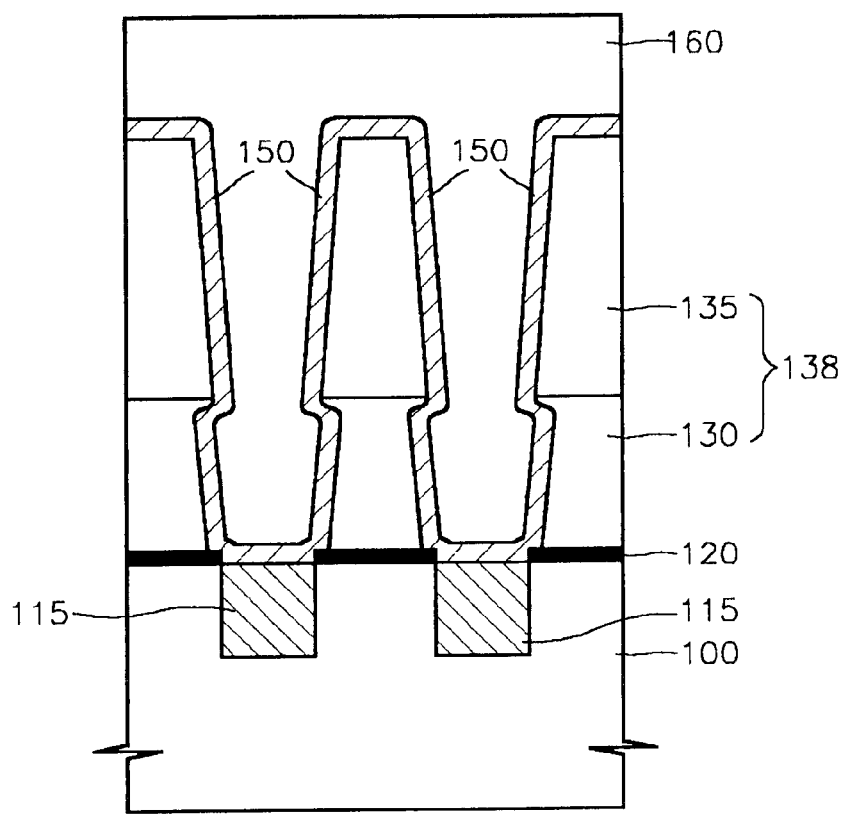
Figure 11:
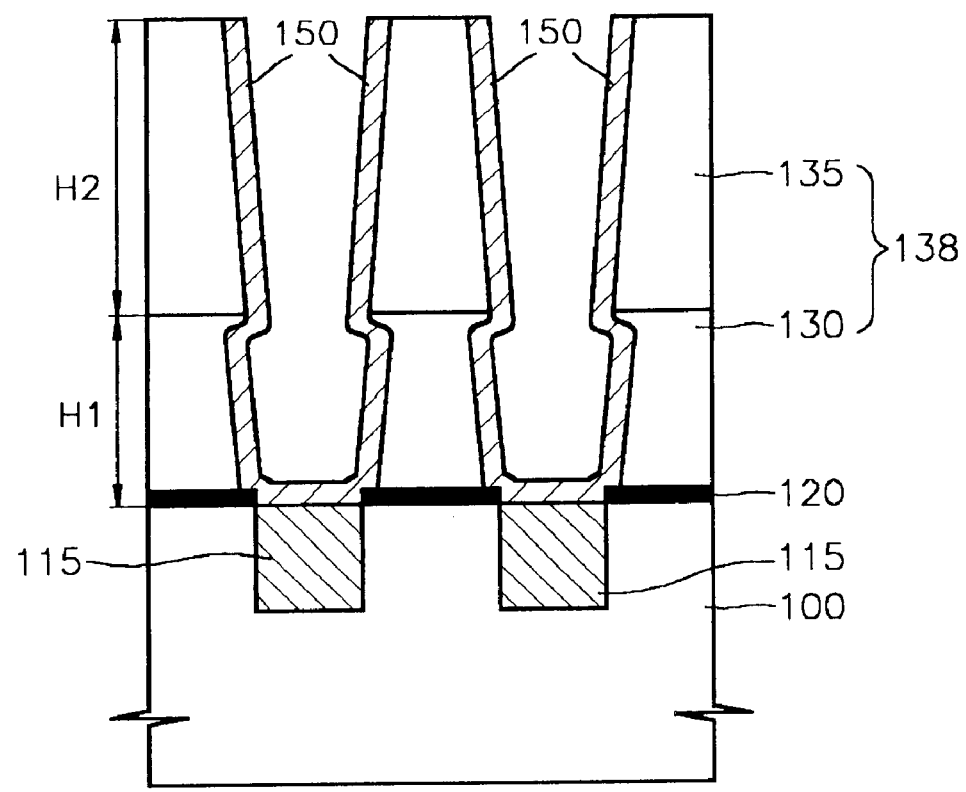

Next, as shown in FIG. 10, an insulating layer 160 is deposited on the entire surface of the resultant structure using a material exhibiting good flowability, for example, BPSG, PSG, or undoped silicate glass (USG), to fill the opening 140'. Then, as shown in FIG. 11, the insulating layer 160 and the conductive layer 150 are partially removed by chemical mechanical polishing (CMP) or dry etchback until a top of the double mold 138 is exposed.

Figure 12A:
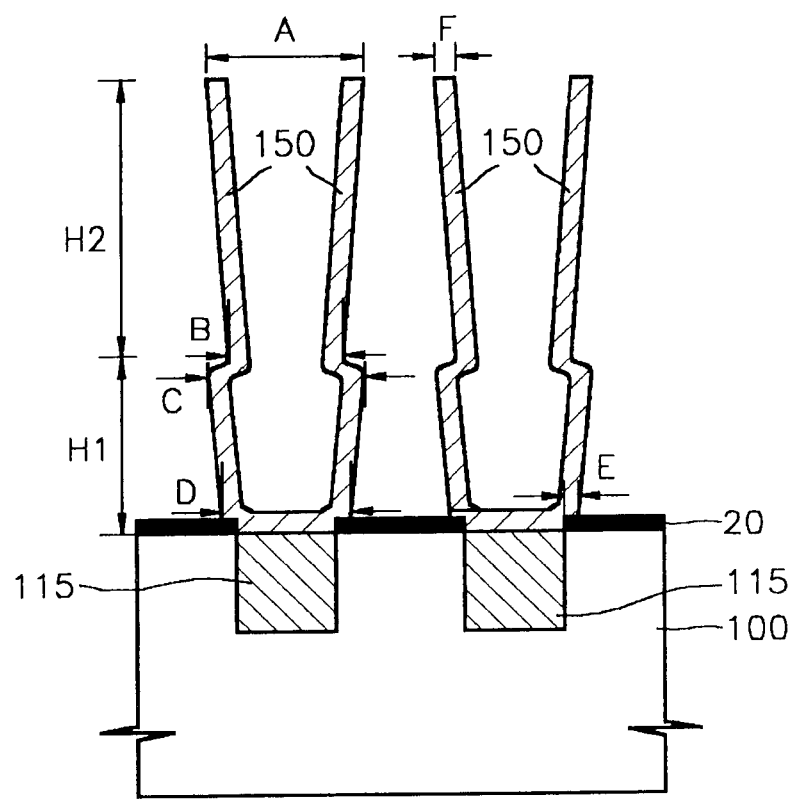
Figure 12B:
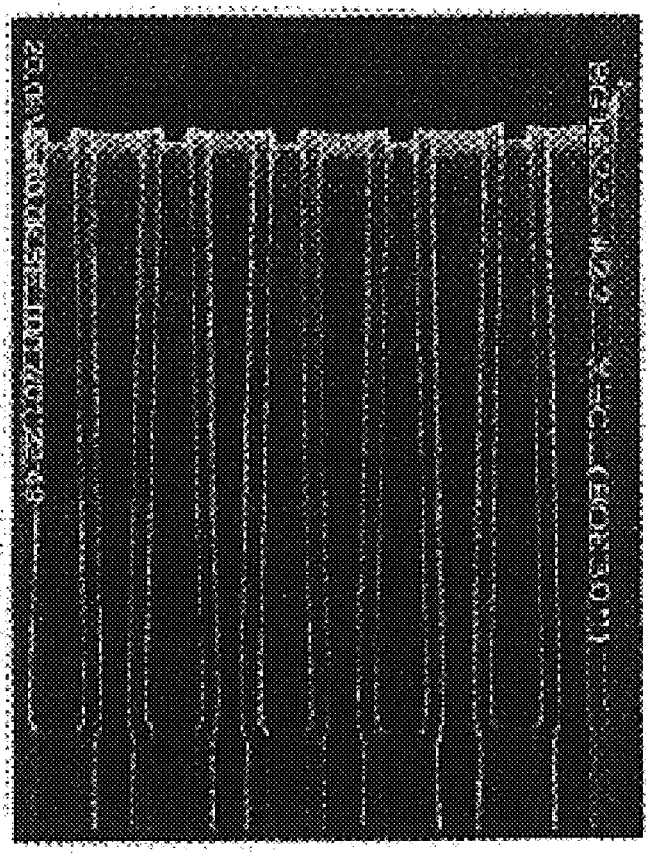

Next, as shown in FIG. 12A, the double mold 138 and the insulating layer 160 are removed using an etchant so that a storage electrode 150 having a one-cylinder stack structure is formed for each cell. In removing the double mold 138, a mixture of HF and $NH_4F$ is preferably used as the removal etchant. Here, since the conductive layer 150 overlaps the etch stop 120, the etchant must travel a substantial distance to permeate into the interlayer insulating layer 100 during the removal of the double mold 138. As such, permeation of the etchant can be avoided. FIG. 12B is a SEM photograph showing the storage electrode 150 formed according to the preferred embodiment of the present invention. As shown, the defects of the prior fabrication methods are not observed.

Figure 13:
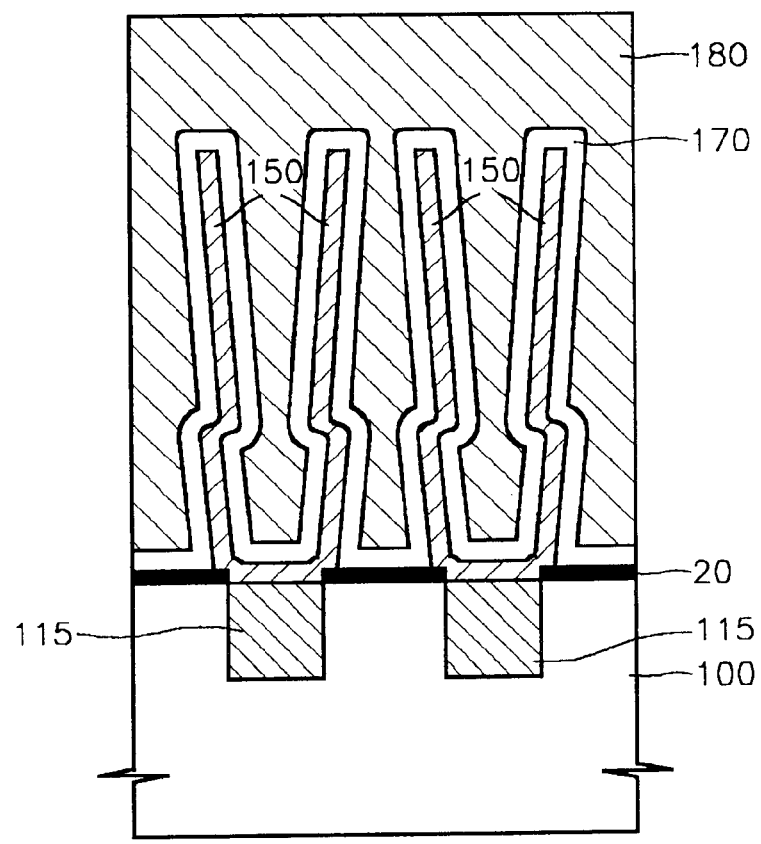

Next, as shown in FIG. 13, a dielectric layer 170 is formed to cover the storage electrode 150, and an upper electrode 180 is formed by a known process to obtain a complete capacitor. The dielectric layer 170 may be an oxynitride (NO) layer, but other materials of sufficiently large dielectric constants (k) may be used as well.

Referring again to FIG. 12A, the storage electrode 150 is in contact with the contact plug 115 and has a vase-like cylindrical structure. In particular, the cylindrical wall of the storage electrode is defined by an upper cylindrical wall portion extending between A and B, a lower cylindrical wall portion extending between C and D, and an intermediate cylindrical wall portion extending between B and C. The diameter of the upper cylindrical wall portion and the diameter of the lower cylindrical wall portion increase (taper outwardly) with an increase in a distance from the surface of the bottom wall, and the diameter of the intermediate cylindrical wall portion decreases (tapers inwardly) with an increase in a distance away from the surface of the bottom wall. According to the preferred embodiment of the present invention, the following relationships are established when configuring the storage electrode 150:

$A>C$, $C \geq B$, and $C>D$ where A is a diameter of the upper cylindrical wall portion at a location farthest from the bottom wall, B is a diameter of the upper cylindrical wall portion at a location nearest to the bottom wall, C is a diameter of the lower cylindrical wall portion at a location farthest from the bottom wall, and D is a diameter of the lower cylindrical wall portion at the bottom wall.

The aforementioned dimensional requirements prevent bridging between adjacent storage electrodes and enable in-line monitoring of the critical dimension D of the outer diameter at the bottom of the storage electrode by measuring only the critical dimension A of the outer diameter at the top of the storage electrode during manufacture of the storage electrode.

Figure 14:
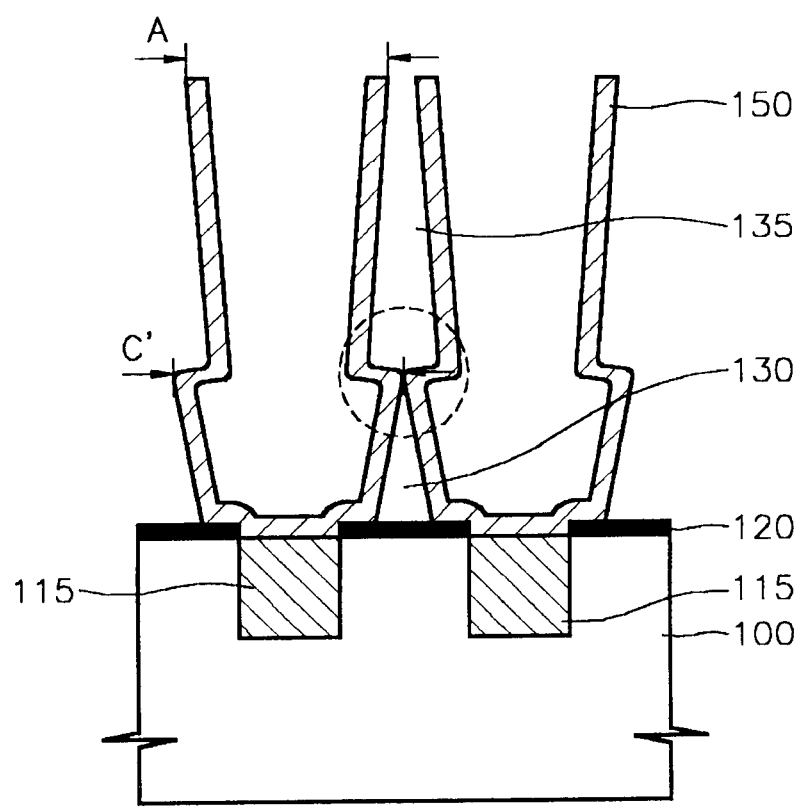
FIG. 14 is a sectional view illustrating a defect that can occur when fabrication conditions of the present invention are not satisfied.

FIG. 14 illustrates the bridging that can occur if the critical dimension C' of the storage electrode 150 is larger than a critical dimension A'. Further, even if actual bridging does not occur between adjacent storage electrodes, a sufficient processing margin is not ensured unless C' is set to be less than or equal to A'.

The properties of the OCS capacitor according to the present invention and a variety of processing parameters applied in the fabrication of the OCS capacitor were determined through the experimental examples described below. It will be appreciated that the numerical values appearing in the following experimental examples may be varied according to the target height and capacitance of a storage capacitor to be fabricated.

EXPERIMENTAL EXAMPLE 1

The properties of a capacitor fabricated by a conventional method using a single mold were compared with those of a capacitor fabricated by the method according to the present invention using a double mold.

Capacitors having 1.6 μm or greater storage electrodes were fabricated using both methods under the same conditions, except that the double mold of the present invention was formed of a 0.5 μm thick BPSG layer as a lower mold and a 1.2 μm thick PE-TEOS layer as an upper mold, whereas the single mold for the convencional method was formed of a single 1.7 μm thick PE-TEOS layer.

Figure 15:
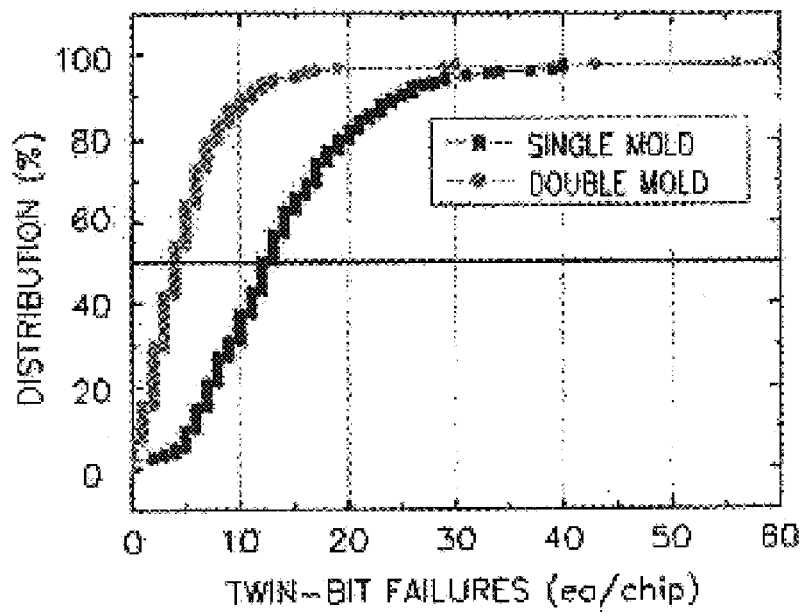
FIGS. 15 through 17 are graphs comparatively showing the properties of capacitors fabricated by the conventional method using a single mold and by the method of the present invention using a double mold.

Referring to FIG. 15, the capacitor fabricated using the single mold showed about 15 twin-bit failures in each cell, which is 3 times more than in the capacitor fabricated using the double mold of the invention, which resulted in about 5 twin-bit failures in each cell. It is evident that the capacitor fabrication method using a double mold according to the present invention can sharply reduce twin-bit failures in resulting cells.

Figure 16:
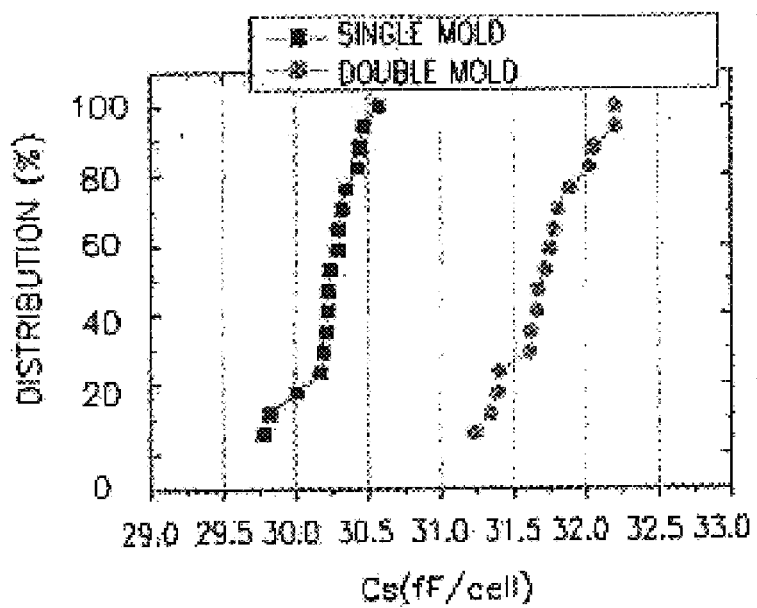

Storage node capacitance Cs was measured for the capacitors fabricated by the conventional method and the method according to the present invention. As shown in FIG. 16, the storage node capacitance Cs for the capacitor fabricated by the method according to the present invention was about 1.5 fF greater for each cell than the storage node capacitance Cs for the capacitor fabricated by the conventional method. This is because that the storage electrode formed by the method according to the present invention using the double mold has a larger bottom area than that formed by the conventional method using the single mold.

EXPERIMENTAL EXAMPLE 2

Figure 17:
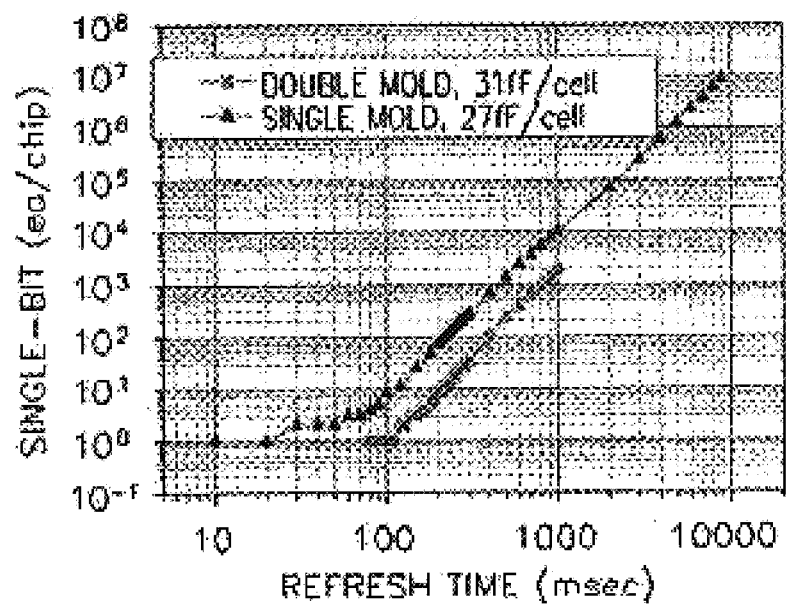

The relationship between bit failure and refresh time was investigated for a capacitor having a 1.4 μm high storage electrode fabricated by the conventional method using a single mold and a capacitor having a 1.6 μm high storage electrode fabricated by the method according to the present invention using a double mold. As shown in FIG. 17, the capacitor formed by the method according to the present invention shows an increased refresh time than the capacitor formed by the conventional method at the same single-bit failure levels. A 4fF-greater capacitance for each cell according to the present invention causes this phenomenon.

EXPERIMENTAL EXAMPLE 3

To screen suitable insulating material layers for the lower mold of the double mold used in the capacitor fabrication method according to the present invention, lower molds were formed of a P—$SiH_4$ layer and a doped BPSG layer, respectively, with an upper mold formed of a PE-TEOS layer. For storage electrodes formed with the respective double molds, the critical dimension of the outer diameter A at the top of the opening, the critical dimension of the outer diameter C at the second inflection point, and the critical dimension of the outer diameter D at the bottom were measured. The results are shown in Table 1.

TABLE 1

| Material | Critical Dimension "A" of Outer Diameter at the Top (nm) | Critical Dimension "C" of Outer Diameter at Second Inflection Point (nm) | Critical Dimension "D" of Outer Diameter at the Bottom (nm) | Bottom to Top (D:A) Opening Ratio (%) |
|---|---|---|---|---|
| P-SiH$_4$ | 215 | 170 | 109 | 51 |
| BPSG | 205 | 192 | 149 | 73 |

As shown in Table 1, a doped insulating layer is suitable as the material layer for the lower mold of the double mold used in the fabrication of a capacitor in accordance with the present invention.

EXPERIMENTAL EXAMPLE 4

To determine an appropriate concentration of dopants in the lower mold insulating layer, storage electrodes were fabricated by the method according to the present invention under the same conditions, but with variations in the concentrations of dopants, boron, and phosphorous in the BPSG lower mold layer. Then, the critical dimension of the outer diameter A at the top of the opening, the critical dimension C of the outer diameter at the second inflection point of the opening, and the critical dimension of the outer diameter D at the bottom of the opening were measured for the respective capacitors. The results are shown in Table 2.

TABLE 2

| Concentrations of B and P in BPSG layer (% by weight) | Critical Dimension "A" of Outer Diameter at the Top (nm) | Critical Dimension "C" of Outer Diameter at Second Inflection Point (nm) | Critical Dimension "D" of Outer Diameter at the Bottom (nm) | Middle to Top (C:A) Opening Ratio (%) | Bottom to Top (D:A) Opening Ratio (%) |
|---|---|---|---|---|---|
| B-2.3/P-2.0 | 218 | 206 | 165 | 94 | 76 |
| B-2.51/P-2.45 | 213 | 205 | 171 | 96 | 80 |
| B-3.0/P-2.75 | 200 | 188 | 151 | 94 | 80 |
| B-3.5/P-3.65 | 212 | 216 | 178 | 102 | 82 |

As shown in Table 1, as the concentrations of B and P in the BPSG layer for the lower mold insulating layer increase, the storage electrodes showed an increase in both the critical dimensions D and C of the outer diameter at the bottom and at the second inflection point due to the increased wet etch rate. For the storage electrode formed with 3.5% by weight of B and 3.65% by weight of P, the critical dimension C of the outer diameter at the second inflection point was greater than the critical dimension A of the outer diameter at the top, resulting a middle opening ratio of 102%.

In addition, since the wet etching process functions at the same time as a pre-cleaning process prior to the formation of the storage electrode, the high etch rate of the lower mold insulating layer ensures sufficient pre-cleaning effect. Accordingly, the concentrations of B and P are preferably 2–3% by weight.

EXPERIMENTAL EXAMPLE 5

Experiments were conducted to determine an optimal thickness of the lower mold insulating layer in which the critical dimension of the outer diameter C at the second inflection point can be held no larger than the critical dimension A of the outer diameter at the top of the opening, while maximizing the critical dimension D of the diameter at the bottom of the opening. In particular, the thickness of a BPSG lower mold layer was varied between 0.3 μm to 0.5 μm, while maintaining a total thickness of the upper and lower mold insulating layers at 1.7 μm. The resulting storage electrodes were measured for the critical dimension A of the outer diameter at the top of the opening, the critical dimension C of the outer diameter at the second inflection point, and the critical dimension D of the outer diameter at the bottom of the opening. The results are shown in Table 3.

TABLE 3

| Thickness of BPSG layer (μm) | Critical Dimension "A" of Outer Diameter at the Top (nm) | Critical Dimension "B" of Outer Diameter at Second Inflection Point (nm) | Critical Dimension "D" of Outer Diameter at the Bottom (nm) | Bottom to Top (D:A) Opening Ratio (%) |
|---|---|---|---|---|
| 0.3 | 217 | 164 | 138 | 64 |
| 0.5 | 207 | 198 | 163 | 79 |

As shown in Table 3, the bottom opening ratio (D: A) and the critical dimension C of the outer diameter at the second inflection point of the storage electrodes were greater for the BPSG layer having a thickness of 0.3 μm than for the BPSG layer having a thickness of 0.5 μm.

Additional storage electrodes were fabricated using double molds each having a 1.9 μm double mold thickness with different BPSG lower mold layer thickness of 0.5 μm, 0.6 μm, 0.7 μm, and 0.8 μm. The critical dimension A of the outer diameter at the top of the opening, the critical dimension C of the outer diameter at the second inflection point, and the critical dimension D of the outer diameter at the bottom of the opening were measured for the respective storage capacitors. The results are shown in Table 4.

TABLE 4

| Thickness of BPSG layer (.m) | Critical Dimension "A" of Outer Diameter at the Top (nm) | Critical Dimension "C" of Outer Diameter at Second Inflection Point (nm) | Critical Dimension "D" of Outer Diameter at the Bottom (nm) | Middle Opening (C:A) Ratio (%) | Bottom Opening (C:A) Ratio (%) |
| --- | --- | --- | --- | --- | --- |
| 0.5 | 243 | 206 | 183 | 85 | 75 |
| 0.6 | 248 | 216 | 176 | 87 | 71 |
| 0.7 | 235 | 221 | 188 | 94 | 80 |
| 0.8 | 243 | 233 | 186 | 96 | 77 |

As shown in Table 4, even where the thickness of the BPSG layer is increased above 0.5 μm, the bottom opening ratio changes very little, while the critical dimension C of the outer diameter at the second inflection point changes significantly. Thus, it is evident that once the thickness of the BPSG layer as a lower mold reaches a particular level, the critical dimension D of the outer diameter at the bottom of the storage electrode is not substantially affected by increasing the thickness of the BPSG layer. Therefore, when the lower mold insulating layer is formed of a BPSG layer, the thickness of the BPSG layer is preferably in the range of 0.5–0.6 μm.

EXPERIMENTAL EXAMPLE 6

To determine an optimal anneal temperature to be performed after formation of a BPSG lower mold layer, BPSG layers were formed on respective silicon nitrite layers and then annealed at 650° C. for 60 min and at 750° C. for 10 min, respectively. Many cracks were observed in the BPSG layer after annealing at 750° C., which is greater than the deposition temperature of the silicon nitrite layer. Therefore, it is evident that annealing should be performed at a temperature lower than the deposition temperature of silicon nitrite layer.

EXPERIMENTAL EXAMPLE 7

Figure 18:
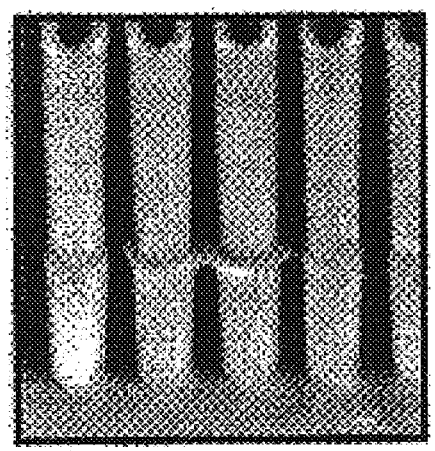
FIGS. 18 and 19 are SEM photographs showing twin-bit failures observed in storage electrodes fabricated without cleaning the lower mold insulating layer.
Figure 19:
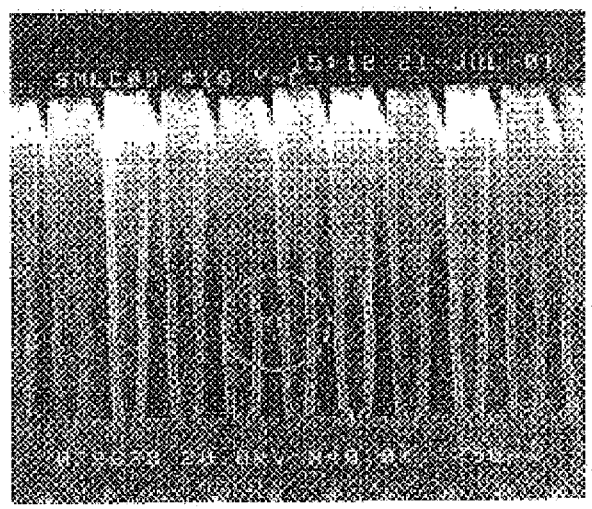

After annealing a BPSG lower mold insulating layer, an upper mold insulating layer was formed on the BPSG layer without first cleaning the surface of the BPSG layer to remove surface defects. Then, a storage electrode was formed using a double mold method according to the present invention and then observed by scanning electron microscopy (SEM). As a result, as shown in FIGS. 18 and 19, rings bounding adjacent storage electrodes (so called "wing defects") were observed at the interface between the upper and lower mold insulating layers of the storage electrodes.

Such wing defects are a cause twin-bit failures and are considered to result from formation of an amorphous defect layer, which has a high etch rate, on the BPSG layer as discussed previously. To remove these defects, the formation of a BPSG lower mold insulating layer was followed by removal of a defect layer under the conditions shown in Table 5. The process of removing the defect layer was performed using a sulfuric acid solution.

TABLE 5

| Sample | Suspension Time before Cleaning (hr) | Suspension Time after Cleaning (hr) | Wing Defect |
| --- | --- | --- | --- |
| 1 | 18 | 0 | no |
| 2 | 24 | 0 | no |
| 3 | 0 | 8 | no |
| 4 | 0 | 18 | no |
| 5 | 0 | 24 | no |
| 6 | 0 | 48 | yes |

As shown in Table 5, even though the lower mold insulating layer after annealing is left unprocessed for about 24 hours before cleaning in a sulfuric acid solution, twin-bit failures can be avoided as in Samples 1 and 2 by the cleaning. Likewise, as in samples 3, 4 and 5, twin-bit failures can be avoided if the upper mold layer is formed within 24 hours cleaning in a sulfuric acid solution of the lower mold layer.

EXPERIMENTAL EXAMPLE 8

Figure 20:
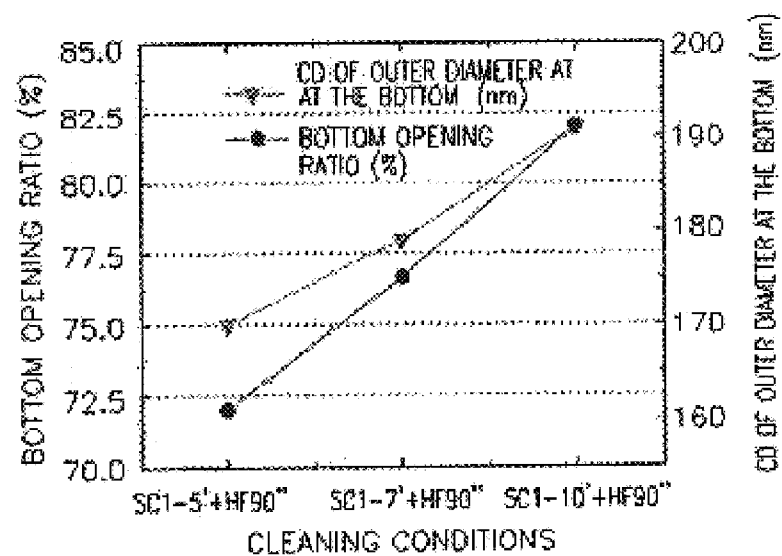
FIG. 20 is a graph showing a relationship between wet etching time and certain critical dimensions of the electrodes of the present invention.

Wet etching the upper and lower mold insulating layers was carried out under different conditions, i.e., SC1 for 5 min/HF for 90 sec, SC1 for 7 min/HF for 90 sec, and SC1 for 10 min/HF for 90 sec. The lower critical dimension D and the bottom opening ratio (D: A) were measured for the respective storage electrodes. The results are shown in FIG. 20. As shown in FIG. 20, as the wet etching time increases, both the critical dimension D of the outer diameter at the bottom and the bottom opening ratio (D: A) of the storage electrode is increased. Therefore, the critical dimension D of the outer diameter at the bottom of a storage electrode can be appropriately controlled by adjusting the wet etching time.

In the method for fabricating a one-cylinder stack (OCS) capacitor using a double mold according to the present invention, the height of the storage electrode can be increased while avoiding twin-bit failures. The OCS capacitor fabrication method also ensures a large critical dimension at the bottom of the storage electrode that is sufficiently large to satisfy capacitance requirements. In addition, no special dielectric material is needed to increase capacitance. It is also possible to in-line monitor a storage electrode being manufactured so that permeation of an etchant into the interlayer insulating layer and the generation of defects by the etchant permeation can be prevented. Also, critical dimensions are established ensure a stable support structure and sufficient capacitance.

Although the invention has been described with reference to the preferred embodiments, the preferred embodiments are for descriptive purposes only. As it will be apparent to one of ordinary skill in the art that modifications of the described embodiments may be made without departing from the spirit and scope of the invention, the scope of the appended claims is not to be interpreted as being restricted to these embodiments.

What is claimed is:

1. A capacitor comprising:
    an interlayer insulating layer having a surface;
    a conductive plug extending at a depth from the surface of the interlayer insulating layer;
    an etch stop layer extending over the insulating layer and exposing the conductive plug;
    a cylindrical lower electrode defined by a cylindrical wall and a bottom wall which extends over a surface of the conductive plug and over a portion of the etch stop layer adjacent the conductive plug, wherein the cylindrical wall extends upwardly from the bottom wall away from the surface of the interlayer insulating layer;

a dielectric layer formed over the cylindrical lower electrode; and an upper electrode formed over the dielectric layer;

wherein the cylindrical wall of the cylindrical lower electrode is defined by an upper cylindrical wall portion, a lower cylindrical wall portion, and an intermediate cylindrical wall portion located between the upper and lower cylindrical wall portions;

wherein a diameter of the upper cylindrical wall portion and a diameter of the lower cylindrical wall portion increase with an increase in a distance from the surface of the bottom wall, wherein a diameter of the intermediate cylindrical wall portions decreases with an increase in a distance away from the surface of the bottom wall, and wherein $A \geq C$, $C > B$, and $C > D$ where A is a diameter of the upper cylindrical wall portion at a location farthest from the bottom wall, B is a diameter of the upper cylindrical wall portion at a location nearest to the bottom wall, C is a diameter of the lower cylindrical wall portion at a location farthest from the bottom wall, and D is a diameter of the lower cylindrical wall portion at the bottom wall.

2. The capacitor of claim 1, wherein the etch stop film is a silicon nitrite film.

3. The capacitor of claim 1, wherein the lower electrode is a polysilicon electrode.

4. The capacitor of claim 1, wherein the dielectric layer is an oxynitride (NO) layer.

5. The capacitor of claim 1 wherein the dielectric layer completely covers the cylindrical lower electrode.

6. The capacitor of claim 5, further comprising an upper electrode completely covering the dielectric layer covering the cylindrical lower electrode.

* * * * *

UNITED STATES PATENT AND TRADEMARK OFFICE
CERTIFICATE OF CORRECTION

| | | |
|---|---|---|
| PATENT NO. | : 6,700,153 B2 | Page 1 of 1 |
| APPLICATION NO. | : 10/136385 | |
| DATED | : March 2, 2004 | |
| INVENTOR(S) | : Jung-Hwan Oh et al. | |

It is certified that error appears in the above-identified patent and that said Letters Patent is hereby corrected as shown below:

Col. 14, line 10, Claim 2, change "nitrite" to -- nitride --.

Signed and Sealed this
Ninth Day of August, 2011

David J. Kappos
*Director of the United States Patent and Trademark Office*